(12) United States Patent
Park et al.

(10) Patent No.: US 8,878,215 B2
(45) Date of Patent: Nov. 4, 2014

(54) LIGHT EMITTING DEVICE MODULE

(75) Inventors: Jun Seok Park, Seoul (KR); Ho Jin Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 45 days.

(21) Appl. No.: 13/412,820

(22) Filed: Mar. 6, 2012

(65) Prior Publication Data

US 2012/0326193 A1    Dec. 27, 2012

(30) Foreign Application Priority Data

Jun. 22, 2011  (KR) .......................... 10-2011-0060540
Jun. 30, 2011  (KR) .......................... 10-2011-0064717

(51) Int. Cl.
*H01L 33/60*    (2010.01)
*H01L 33/52*    (2010.01)

(52) U.S. Cl.
CPC ..................................... *H01L 33/52* (2013.01)
USPC ........................................... 257/98; 362/609

(58) Field of Classification Search
USPC ........................................... 257/98; 362/609
See application file for complete search history.

(56) References Cited

U.S. PATENT DOCUMENTS

| 8,314,438 | B2 * | 11/2012 | Lin et al. | 257/98 |
| 2009/0147498 | A1 * | 6/2009 | Park | 362/84 |
| 2011/0133156 | A1 * | 6/2011 | Won et al. | 257/13 |
| 2011/0198658 | A1 * | 8/2011 | An | 257/99 |

* cited by examiner

*Primary Examiner* — Zandra Smith
*Assistant Examiner* — Damian A Hillman
(74) *Attorney, Agent, or Firm* — Birch, Stewart, Kolasch & Birch, LLP

(57) ABSTRACT

Disclosed is a light emitting device module. The light emitting device module includes a first lead frame and a second lead frame electrically separated from each other, a light emitting device electrically connected to the first lead frame and the second lead frame, the light emitting device includes a light emitting structure having a first conduction type semiconductor layer, an active layer, and a second conduction type semiconductor layer, a dam disposed at the peripheral area of the light emitting device, a resin layer surrounding the light emitting device and disposed at the inner area of the dam, and a reflective member disposed at the peripheral area of the dam and including an inclined plane formed on at least one side surface thereof.

13 Claims, 14 Drawing Sheets

LIGHT EMITTING DEVICE MODULE

TECHNICAL FIELD

Embodiments relate to a light emitting device module.

BACKGROUND

Light emitting devices, such as light emitting diodes or laser diodes using group III-V or II-VI compound semiconductor materials, implement light of various colors, such as red, green, blue, and ultraviolet light, due to development of thin film growth techniques and device materials, and implement white light having high efficiency using fluorescent materials or through color mixing.

Due to development of such technology, light emitting devices are increasingly applied not only to display devices, but also to transmission modules of optical communication units, light emitting diode backlights substituting for cold cathode fluorescent lamps (CCFLs) constituting backlights of liquid crystal display (LCD) devices, lighting apparatuses using white light emitting diodes substituting for fluorescent lamps or incandescent lamps, head lights for vehicles and traffic lights.

The light emitting devices are mounted on a package body, thus forming a light emitting device package. In the light emitting device package, a pair of lead frames is mounted on the package body formed of silicon or PPA resin, and the light emitting devices are electrically connected to the lead frames.

SUMMARY

Embodiments provide a light emitting device module.

In one embodiment, a light emitting device module includes a first lead frame and a second lead frame electrically separated from each other, a light emitting device electrically connected to the first lead frame and the second lead frame, the light emitting device includes a light emitting structure having a first conduction type semiconductor layer, an active layer, and a second conduction type semiconductor layer, a dam disposed at the peripheral area of the light emitting device, a resin layer surrounding the light emitting device and disposed at the inner area of the dam, and a reflective member disposed at the peripheral area of the dam and including an inclined plane formed on at least one side surface thereof.

The light emitting device module may further include a first electrode pad and a second electrode pad respectively disposed on at least partial areas of the first lead frame and the second lead frame.

The horizontal cross-section of the inclined plane may form a curved shape around the light emitting device.

The height of the dam may be 40 μm to 60 μm.

At least one stepped structure may be formed on the upper surface of the dam.

The edge of the resin layer may be disposed to the stepped structure.

A groove may be formed on the upper surface of the dam, and the edge of the resin layer is disposed to the groove.

The light emitting device module may further include a PSR (photo solder resist) layer disposed between the first lead frame and the second lead frame and the reflective member is disposed on the PSR.

The fixing member is a double-sided adhesive or a double-sided adhesive tape.

The dam may be formed on the PSR layer through printing.

At least one of the first lead frame and the second lead frame may contact a heat dissipation layer through an insulating layer disposed therebetween.

The width of the uppermost end of the inclined plane of the reflective member may be 1.5 times to 2 times the width of the resin layer disposed to the dam.

In another embodiment, A light emitting device module includes a first lead frame and a second lead frame disposed on a package body and electrically separated from each other; a light emitting device electrically connected to the first lead frame and the second lead frame, the light emitting device includes a light emitting structure having a first conduction type semiconductor layer, an active layer, and a second conduction type semiconductor layer; and resin layers surrounding the light emitting device and disposed on the package body, wherein a sealant is disposed at the edge of a connection area of the package body and the resin layer.

The resin layers may include a first resin layer configured to convert light of a first wavelength range emitted from the light emitting device into light of a second wavelength range, and a second resin layer disposed around the first resin layer configured to change a path of light emitted from the first resin layer.

The height of the first resin layer may be equal to the height of the package body.

The sealant may be disposed on the package body.

The sealant may include a primer composition.

A dam is disposed on the package body.

The width of the lower portion of the dam may be greater than the width of the upper portion of the dam.

In a further embodiment, A lighting system includes a light emitting device module including a first lead frame and a second lead frame electrically separated from each other, a light emitting device electrically connected to the first lead frame and the second lead frame, the light emitting device includes a light emitting structure having a first conduction type semiconductor layer, an active layer, and a second conduction type semiconductor layer, a dam disposed at the peripheral area of the light emitting device, a resin layer surrounding the light emitting device and disposed at the inner area of the dam, and a reflective member disposed at the peripheral area of the dam and including an inclined plane formed on at least one side surface thereof: and an optical member for transmission of a light from the light emitting device module.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

Figure 1:
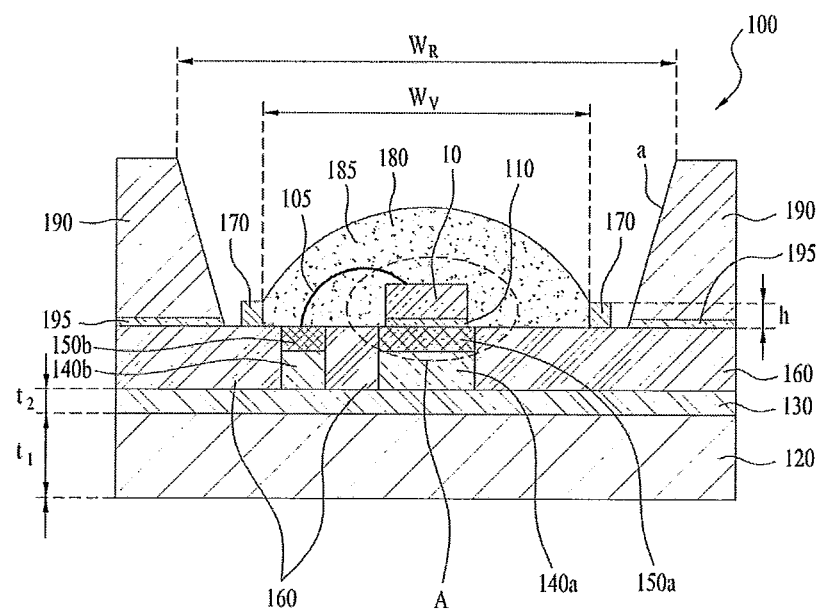
FIG. 1 is a longitudinal-sectional view of a light emitting device module in accordance with a first embodiment.

FIG. 1 is a longitudinal-sectional view of a light emitting device module in accordance with a first embodiment.

A light emitting device module 100 in accordance with this embodiment includes a pair of first lead frame 140a and second lead frame 140b electrically separated from each other, and a light emitting device 10 electrically connected to the first lead frame 140a and second lead frame 140b. The first lead frame 140a and second lead frame 140b contact a heat dissipation layer 120 through an insulating layer 130.

The heat dissipation layer 120 may be formed of a material having excellent heat conductivity, such as aluminum (Al), and the insulating layer 130 may be formed of a material having excellent heat conductivity so as to transmit heat discharged from the first lead frame 140a and second lead frame 140b to the heat dissipation layer 120.

A thickness $t_1$ of the heat dissipation layer 120 may be 0.6 mm, and a thickness $t_2$ of the insulating layer 130 may be 0.1 mm. The respective values may have a tolerance of 10%.

A printed solder resistor (PSR) layer 160 may be disposed on the insulating layer 130 between the first lead frame 140a and second lead frame 140b. The PSR layer 160 may improve brightness of the light emitting device module. The PSR layer 160 may be formed of an insulating layer to prevent an electrical short between the first lead frame 140a and second lead frame 140b.

Electrode pads 150a and 150b may be respectively disposed on the upper surfaces of the first lead frame 140a and second lead frame 140b. The electrode pads 150a and 150b may be formed of silver (Ag). Although FIG. 1 illustrates the electrode pads 150a and 150b as being disposed at the same areas as the first lead frame 140a and second lead frame 140b, the electrode pads 150a and 150b may be disposed at at least partial areas of the first lead frame 140a and second lead frame 140b. The electrode pads 150a and 150b may include a first electrode pad and a second electrode pad.

The first lead frame 140a and second lead frame 140b may have a thickness of 0.05 mm, and the electrode pads 150a and 150b may have a thickness of 0.01 mm. The thickness of the first lead frame 140a and second lead frame 140b may be 5 times the thickness of the electrode pads 150a and 150b, and these values may have a tolerance of 10%.

The first lead frame 140a and second lead frame 140b may reflect light emitted from the light emitting device 10 to increase light efficiency. Here, the electrode pads 150a and 150b formed of silver (Ag) may increase light reflection.

The light emitting device 10 may be electrically connected to the first lead frame 140a and second lead frame 140b, and may be one of a vertical type light emitting device, a horizontal type light emitting device and a flip type light emitting device. In this embodiment, the light emitting device 10 electrically contacts one lead frame 140a through a conductive adhesive layer 110, and electrically contacts the other lead frame 140b through a wire 105.

In these embodiments or other embodiments, the light emitting device 10 may be semiconductor light emitting device, for example light emitting diode.

A resin layer 180 may surround the light emitting device 10 to protect the light emitting device 10. Further, the resin layer 180 may include phosphors 185 to change the wavelength of light emitted from the light emitting device 10. The resin layer 180 may cover at least the light emitting device 10 and the wire 105.

Light of a first wavelength range emitted from the light emitting device 10 may be excited by the phosphors 185 and converted into light of a second wavelength range, and an optical path of the light of the second wavelength range may be changed while passing through an optical path change unit, such as a lens (not shown).

The lens may change the optical path of light, emitted from the light emitting device 10 and having a wavelength converted by the phosphors 185, through refraction, and particularly, may adjust an orientation angle when the light emitting device module is used in a backlight unit.

The lens may be formed of a material having excellent light transmittance, for example, polymethylmethacrylate (PMMA), polycarbonate (PC), polyethylene (PE) or a resin injection-molded product.

Further, a dam 170 may be disposed at the peripheral area of the light emitting device 10, and may fix the edge of the resin layer 180. That is, after the resin layer 180 surrounding the light emitting device 10 is formed, the resin layer 180 is disposed at the inner area of the dam 170 under the condition that the edge of the resin layer 180 is fixed by the dam 170. The dam 170 may be disposed in a circular or oval shape. And, the dam 170 may fix the edge of the resin layer 180.

The height of the dam 170 may be 40 μm to 60 μm. If the height of the dam 170 is excessively low, the dam 170 may not sufficiently fix the resin layer 180, and if the height of the dam 170 is excessively high, the dam 170 may influence progress of light emitted from the light emitting device 10 in the horizontal direction.

Further, a reflective member 190 may be disposed to be separated from the dam 170 by a predetermined interval. In this embodiment, since a cavity is not disposed around the light emitting device 10 and thus light emitted from the light emitting device 10 may be discharged toward the side surface of the light emitting device module 100 in a large amount, the reflective member 190 may reflect light discharged toward the side surface to adjust the orientation angle of the light emitting device module 100.

The reflective member 190 may be formed of a material having high reflectivity, and may include an inclined plane on an inner surface a thereof, as shown in FIG. 1, to increase reflection efficiency of light emitted from the light emitting device 10. As a fixing member 195 to fix the reflective member 190 to the PSR layer 160, a double-sided adhesive or a double-sided adhesive tape may be used.

The width $W_R$ of the uppermost end of the inclined plane of the reflective member 190 becomes an opening through which light emitted from the light emitting device module 100 is discharged. The width $W_R$ of the opening may be 1.5 times to 2 times the width $W_v$ of the resin layer 180 fixed to the dam 170, and may have a large range because the reflective member 190 has an oval shape.

Although this embodiment illustrates one light emitting device as being disposed within one light emitting device module, plural light emitting devices may be disposed within one light emitting device. If three light emitting devices are disposed within one light emitting device, light emitting devices emitting red light, green light and blue light may be disposed within the light emitting device.

FIGS. 2 to 7 are longitudinal-sectional views illustrating a fabrication process of the light emitting device module of FIG. 1.

Figure 2:
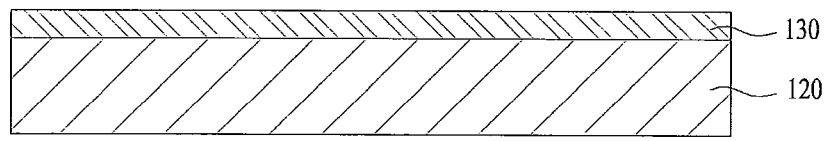
FIGS. 2 to 7 are longitudinal-sectional views illustrating a fabrication process of the light emitting device module of FIG. 1.

First, as shown in FIG. 2, the insulating layer 130 is prepared on the heat dissipation layer 120. The heat dissipation layer 120 may be formed of aluminum, and the insulating layer 130 may be formed of an insulating material having excellent heat conductivity.

Figure 3:
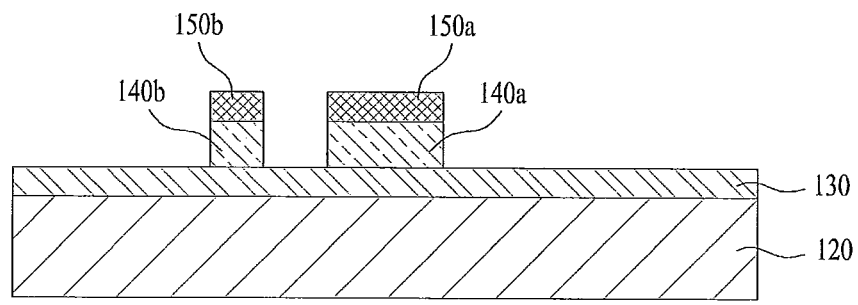

Thereafter, as shown in FIG. 3, the first lead frame 140*a* and second lead frame 140*b* and the electrode pads 150*a* and 150*b* are disposed on the insulating layer 130. The first lead frame 140*a* and second lead frame 140*b* may be formed by preparing a material having excellent electric conductivity, such as copper (Cu), on the surface of the insulating layer 130 and then patterning the material using a mask.

The electrode pads 150*a* and 150*b* may be disposed to have an area equal to or smaller than the first lead frame 140*a* and second lead frame 140*b* through patterning. The electrode pads 150*a* and 150*b* may prevent discoloration of the first lead frame 140*a* and second lead frame 140*b* as well as increase reflectivity of the first lead frame 140*a* and second lead frame 140*b*. The electrode pads 150*a* and 150*b* may be formed by coating, and may be disposed in plural layers using $SiO_2$ or $TiO_2$.

Figure 4:
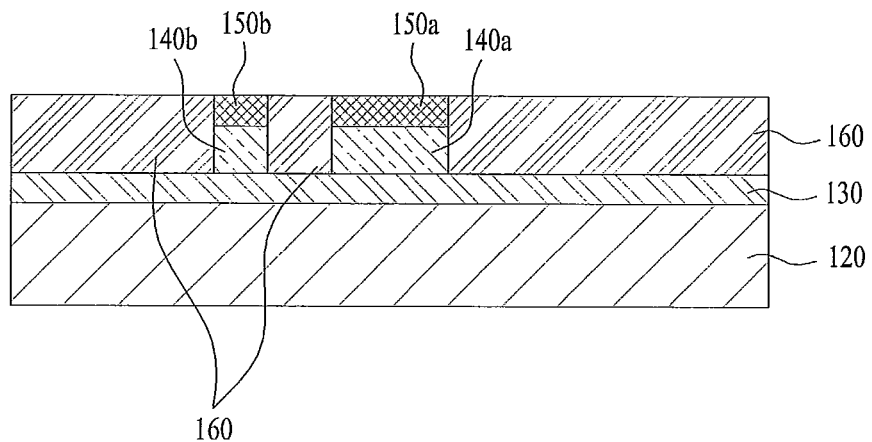

Thereafter, as shown in FIG. 4, the PSR layer 160 fills portions between the first lead frame 140*a* and second lead frame 140*b*, thereby preparing areas where the reflective member or the resin layer will be formed, and preventing an electrical short between the first lead frame 140*a* and second lead frame 140*b*.

Figure 5:
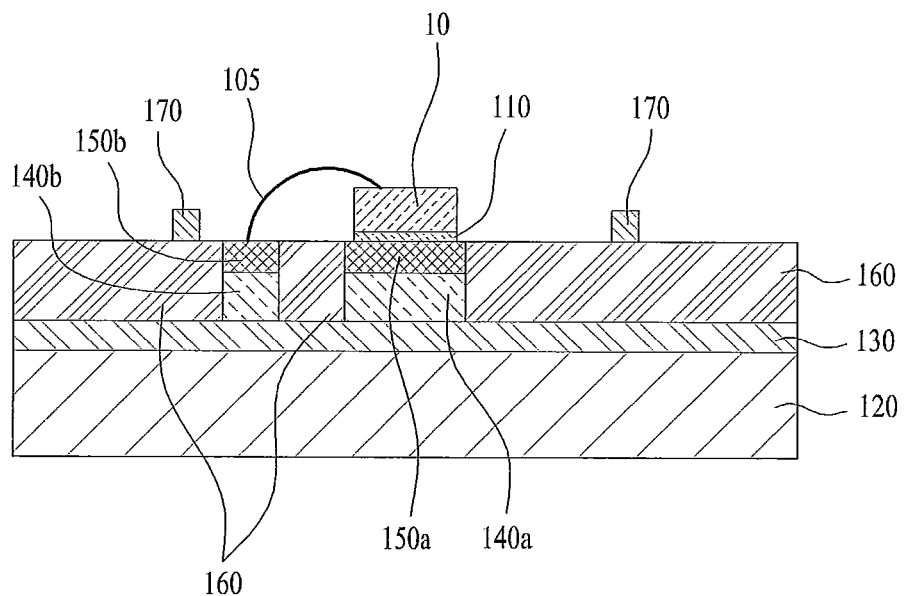

Thereafter, as shown in FIG. 5, the light emitting device 10 is disposed to one lead frame 140*a* and the electrode pad 150*a* disposed thereon through the conductive adhesive layer 110, and is electrically connected to the other lead frame 140*b* and the electrode pad 150*b* disposed thereon through the wire 105.

Thereafter, the dam 170 is disposed at the peripheral area of the light emitting device 10. The dam 170 serving to fix the resin layer may be disposed on the PSR layer 160 by printing, such as a silk screen method.

Figure 6:
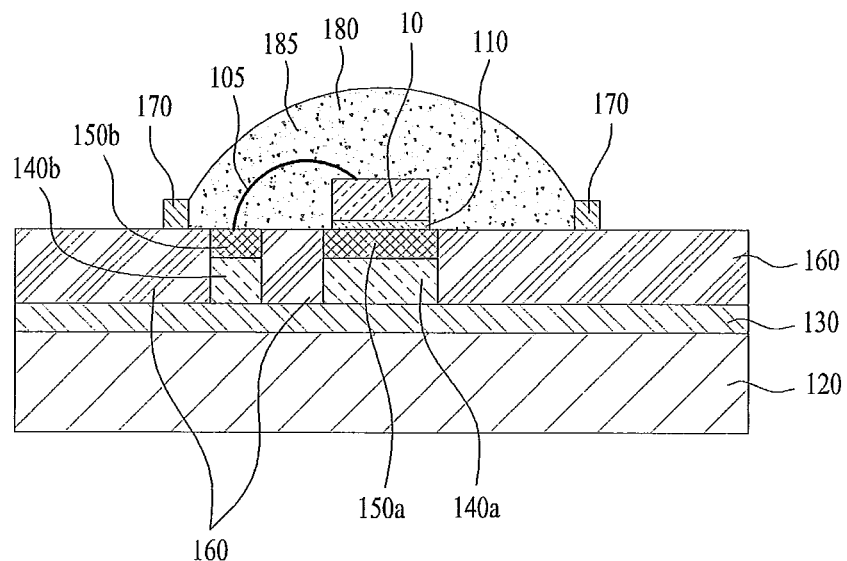

Thereafter, as shown in FIG. 6, the resin layer 180 may be disposed around the light emitting device 10 by applying and hardening a resin. The resin layer 180 may include the phosphors 185, and may be disposed in a circular or oval shape by the dam 170 fixing the edge of the resin layer 180.

Figure 7:
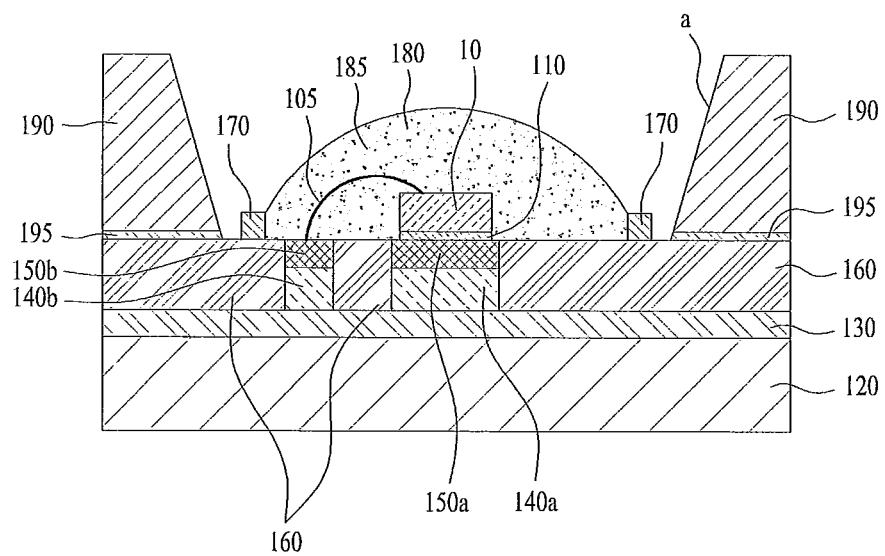

Thereafter, as shown in FIG. 7, the reflective member 190 may be fixed to the upper surface of the PSR layer 160 through the fixing member 195. A cavity formed by the PSR layer 160 and the reflective member 160 may function as a reflective cup. The inner surface of the reflective member 190 may be inclined, and the reflective member 190 may prevent infiltration of foreign substances from the outside through moisture proof coating.

FIGS. 8 to 11 are longitudinal sectional views of light emitting device modules in accordance with second to fifth embodiments, respectively.

Figure 8:
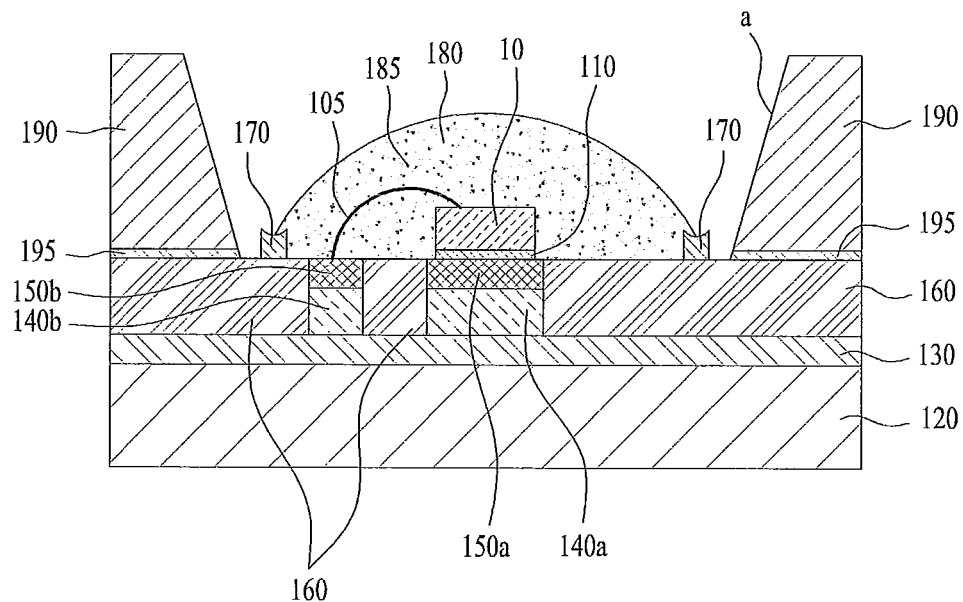
FIGS. 8 to 11 are longitudinal sectional views of light emitting device modules in accordance with second to fifth embodiments, respectively.

In the embodiment shown in FIG. 8, a V-shaped groove or U-shaped groove is disposed on the upper surface of the dam 170, and the edge of the resin layer 180 is fixed to the groove. Here, fixation of the edge of the resin layer 180 may be facilitated by the groove.

Figure 9:
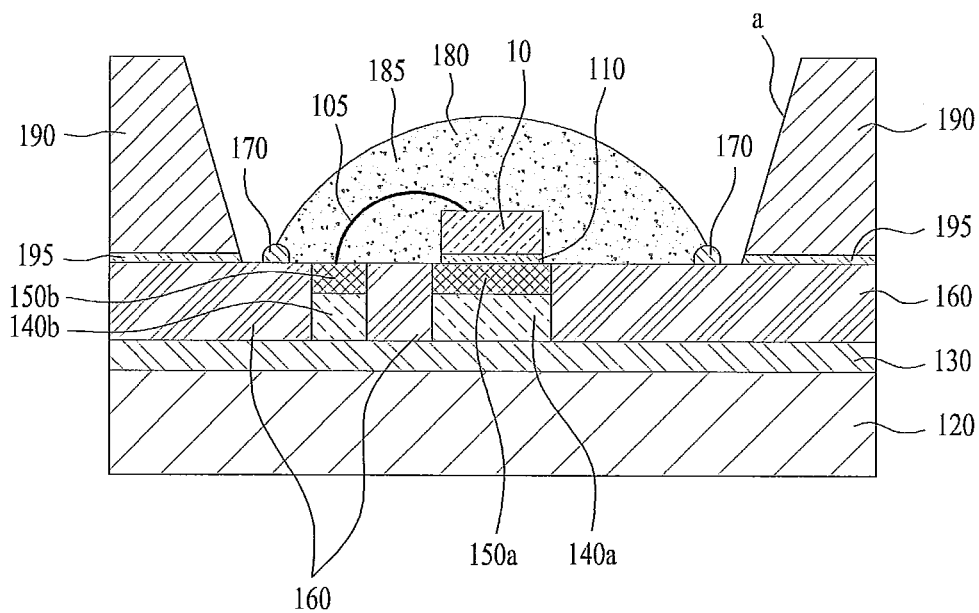

In the embodiment shown in FIG. 9, the upper surface of the dam 170 is rounded, and the edge of the resin layer 180 is fixed to the rounded upper surface of the dam 170.

Figure 10:
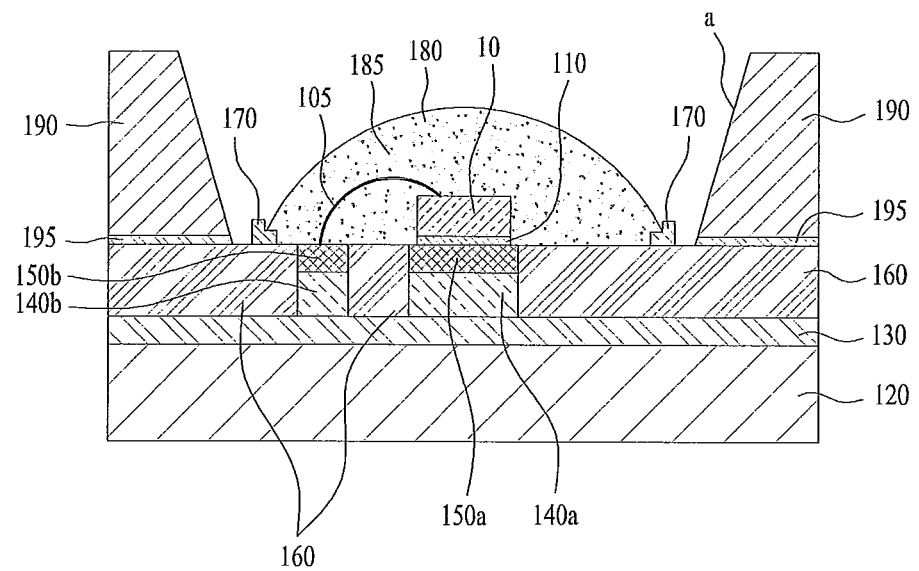
Figure 11:
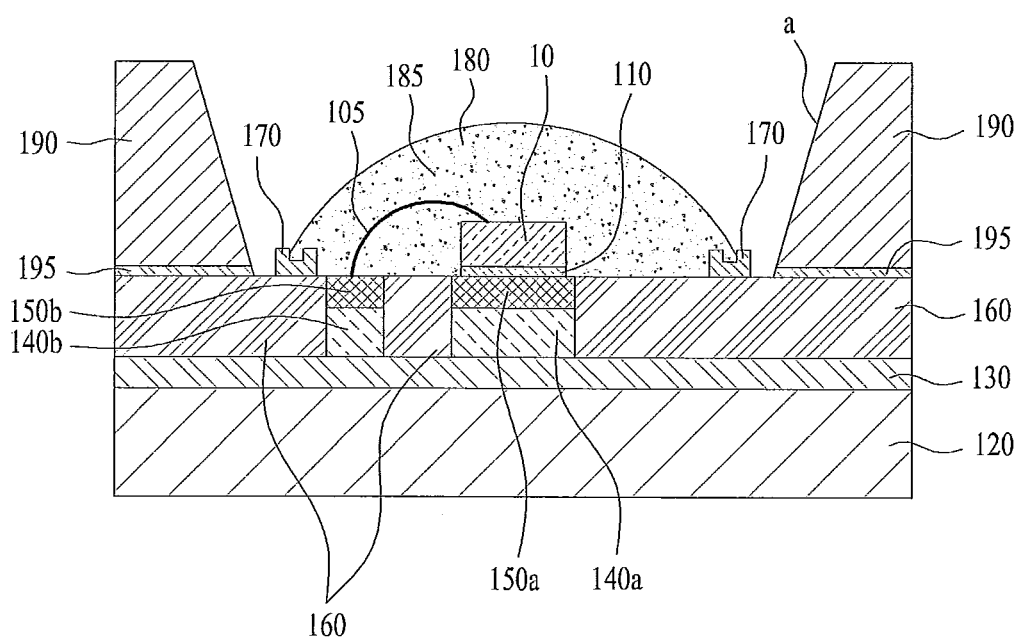

In the embodiment shown in FIG. 10 or the embodiment shown in FIG. 11, a stepped structure or a groove is formed on the upper surface of the dam 170 to facilitate the fixation of the edge of the resin layer 180. In the embodiment shown in FIG. 10, the stepped structure is formed on the upper surface of the dam 170 such that the edge of the dam 170 is disposed at a higher position than other portions of the dam 170. Further, in the embodiment shown in FIG. 11, the stepped structure or the groove is formed on the upper surface of the dam 170 to fix the edge of the resin layer 180.

Figure 12:
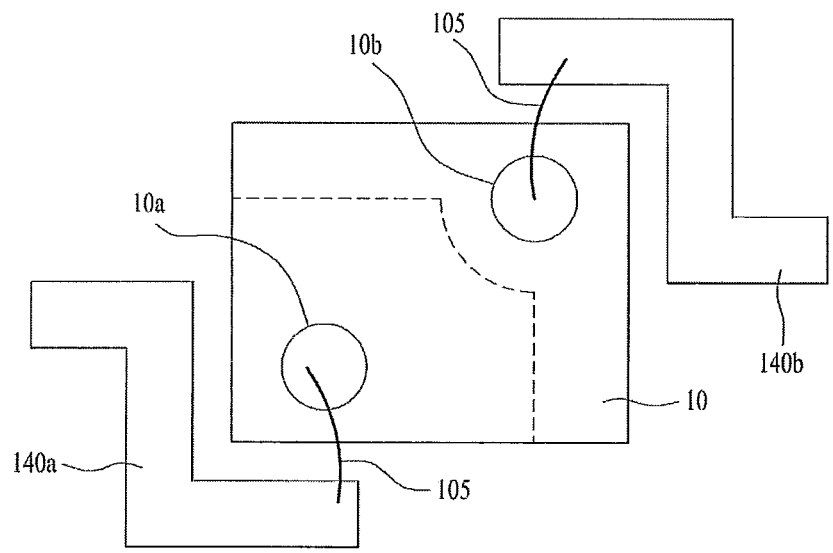
FIG. 12 is a view illustrating one example of a wiring structure of a light emitting device of the portion 'A' of FIG. 1.

FIG. 12 is a view illustrating one example of a wiring structure of the light emitting device of the portion 'A' of FIG. 1.

The horizontal type light emitting device of FIG. 1 is disposed, a first electrode 10*a* is connected to a first lead frame 140*a* through a wire 105, and a second electrode 10*b* is connected to a second lead frame 140*b* through a wire 105. Here, electrode pads may be respectively disposed on the surfaces of the first lead frame 140*a* and the second lead frame 140*b*.

In this embodiment, the first lead frame 140*a* and the second lead frame 140*b* are diagonally disposed around the horizontal type light emitting device 10, and thus a disposition area of the first lead frame 140*a* and the second lead frame 140*b* within the light emitting device module may be reduced.

Figure 13:
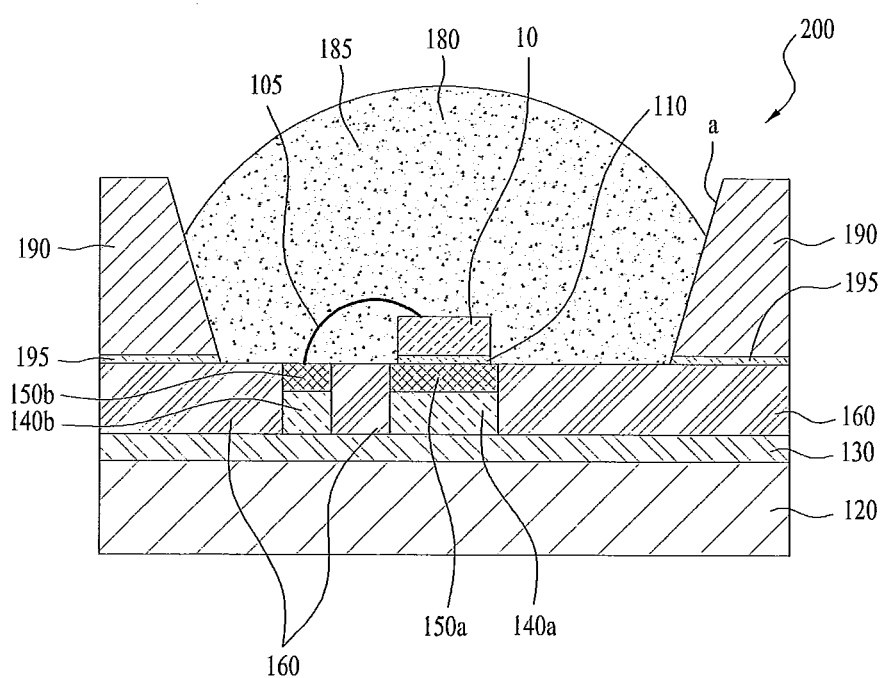
FIG. 13 is a longitudinal-sectional view of a light emitting device module in accordance with a sixth embodiment.

FIG. 13 is a longitudinal-sectional view of a light emitting device module in accordance with a sixth embodiment.

In this embodiment, the dam 170 is omitted and reflective member 190 fixes the edge of the resin layer 180, differently from the above-described embodiments. Although this embodiment illustrates the height of the resin layer 180 as being lower than the height of the reflective member 190, the height of the resin layer 180 may be higher than the height of the reflective member 190.

Figure 14:
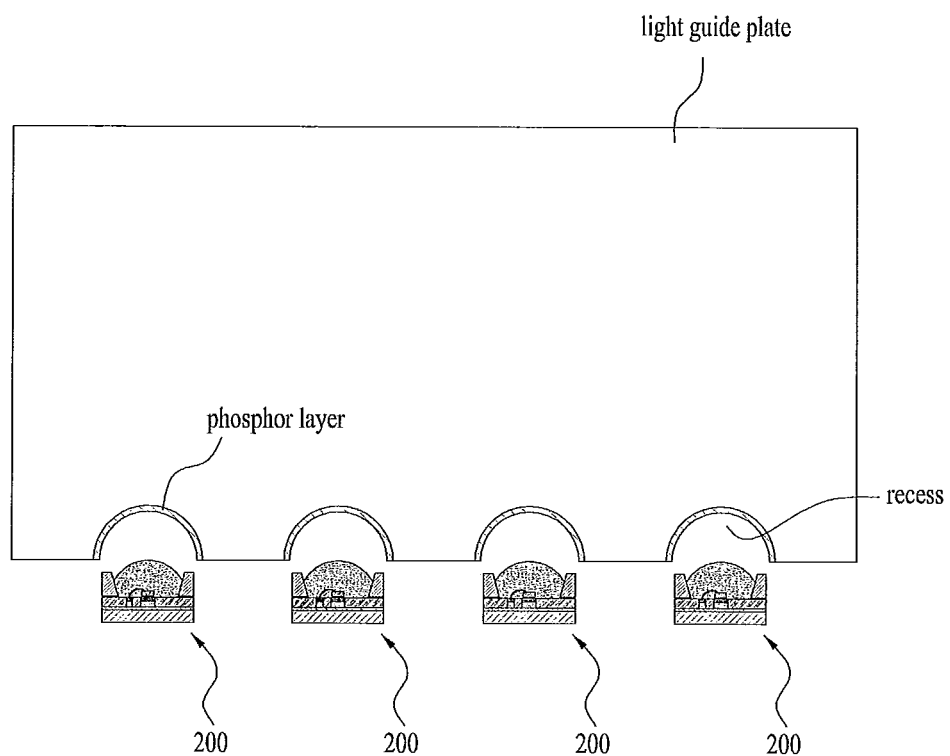
FIG. 14 is a view illustrating arrangement of a light emitting device module array and a light guide plate.

FIG. 14 is a view illustrating arrangement of a light emitting device module array and a light guide plate. If the height of a resin layer is higher than the height of a reflective member in an embodiment shown in FIG. 14, or a lens is disposed on the resin layer such that the height of the lens is higher than the height of the reflective member, when light emitting device modules are used in a backlight unit, a light guide plate may be disposed in a manner described below.

In FIG. 14, a plurality of recesses is formed at one edge of the light guide plate, light emitting device modules 100 are respectively disposed in the recesses. That is, if the light emitting device modules 100 directly contact the light guide plate when the height of the resin layer or the lens in the light emitting device module 100 is greatest, the resin layer or the lens may be damaged. Therefore, the recesses are formed on the light guide plate to prevent the resin layer or the lens, which will be described later, from directly contacting the light guide plate.

In both the above-described embodiments and embodiments which will be described later, both the resin layer and the lens may change a path of light emitted from the light emitting device, the resin layer may be referred to as a first resin layer, and the lens may be referred to as a second resin layer.

Further, the inner surfaces of the recesses formed on the light guide plate may be coated with a phosphor layer. In this case, the phosphors within the resin layer of the light emitting device module may be omitted.

Figure 15:
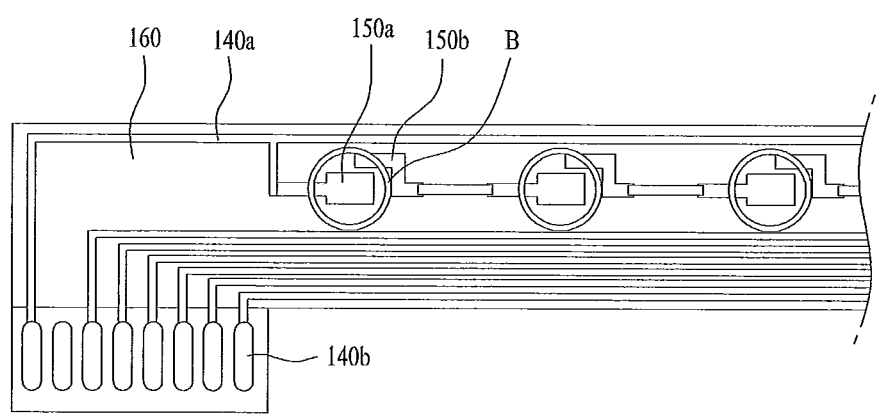
FIGS. 15 and 16 are views illustrating the light emitting device module array.
Figure 16:
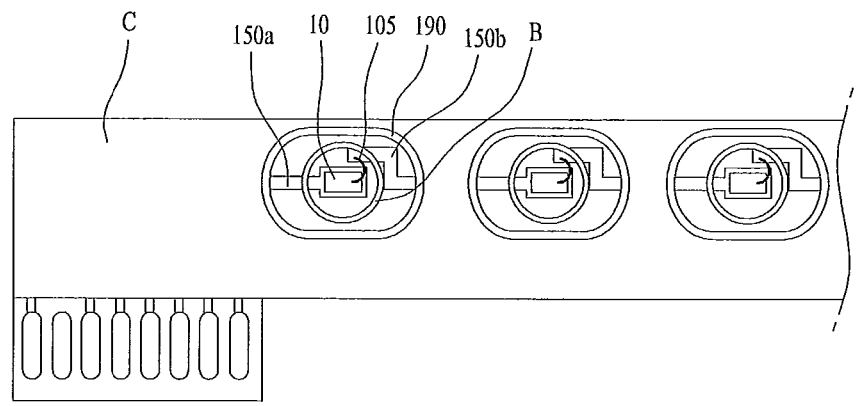

FIGS. 15 and 16 are views illustrating the light emitting device module array.

A first lead frame 140a may supply a drive signal to the light emitting devices, and thus may be used in common in the respective light emitting devices and be an anode. Second lead frames 140b may be respectively connected to the light emitting devices and be cathodes.

In FIG. 15, an area B where a dam will be disposed is disposed at the edge of an area where the light emitting device will be disposed, an electrode pad a may be disposed on the first lead frame 140a at the area where the light emitting device will be disposed, and another electrode pad b may be disposed at an area where the second lead frame 140b will be connected to the light emitting device. Such an arrangement of the electrode pads 150a and 150b may be applied to a vertical type light emitting device. Further, the first lead frame 140a and second lead frame 140b are disposed and the PSR layer 160 may be exposed at other areas.

In FIG. 16, the light emitting device 10 is disposed on the electrode pad 150a of the first lead frame 140a of FIG. 15 and is connected to the second lead frame 140b through the wire 105, and the reflective member 90 is disposed at the edge of the area B where the dam is disposed.

The shape of the reflective member 190 greatly influences a projection area of light emitted from the light emitting device. In this embodiment, the reflective member 190 is disposed in an oval shape, and the horizontal cross-section of the reflective member 190, i.e., the cross-section of the inclined plane on the inner surface of the reflective member 190 when the reflective member 190 is cut in a direction parallel with the arrangement direction of the first lead frame and the second lead frame, forms an oval shape. Here, the oval shape of the inclined plane of the inner surface of the reflective member 190 may be configured such that the long radius of the oval shape of the inclined plane is 180 to 220% of the short radius of the oval shape of the inclined plane.

Figure 17:
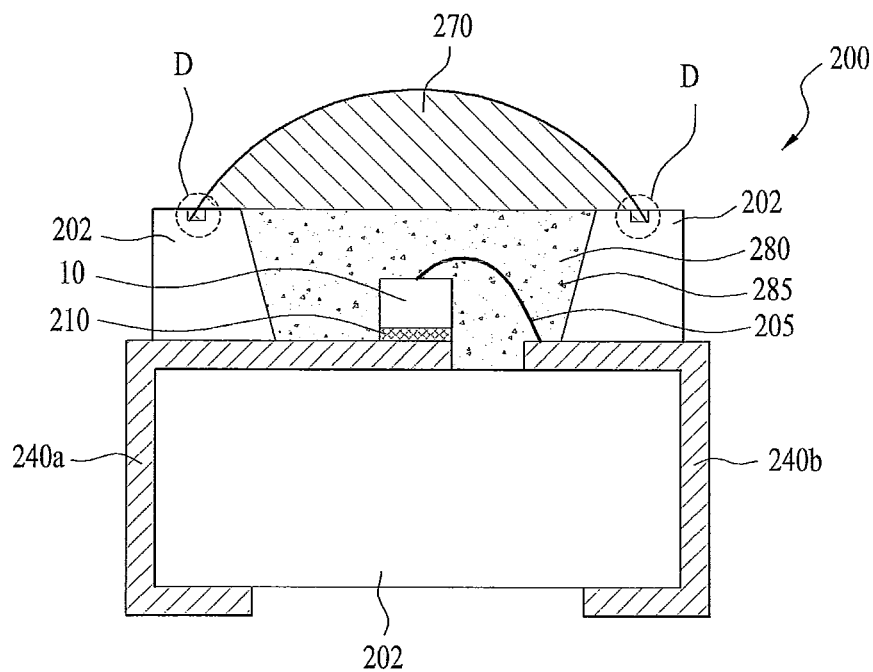
FIG. 17 is a longitudinal-sectional view of a light emitting device module in accordance with a seventh embodiment.

FIG. 17 is a longitudinal-sectional view of a light emitting device module in accordance with a seventh embodiment.

In this embodiment, a light emitting device module 200 includes a body 202, a first lead frame 240a and a second lead frame 240b installed on the body 202, a light emitting device 10 installed on the body 202 and electrically connected to the first lead frame 240a and the second lead frame 240b, and a resin layer 280 surrounding the side surface and/or the upper surface of the light emitting device 10.

The body 202 may be formed of silicon, a synthetic resin or a metal. If the body 202 is formed of a conductive material, such as a metal, the surface of the body 202 is coated with an insulating layer (not shown) to prevent an electrical short between the first lead frame 240a and second lead frames 240b.

The first lead frame 240a and the second lead frame 240b are electrically separated from each other, and supply current to the light emitting device 10. Further, the first lead frame 240a and the second lead frame 240b may reflect light emitted from the light emitting device 10 to increase light efficiency, and may discharge heat generated from the light emitting device 10 to the outside.

The light emitting device 10 may be one of a vertical type light emitting device, a horizontal type light emitting device and a flip type light emitting device, and may be installed on the body 202 or installed on the first lead frame 240a or the second lead frame 240b. In this embodiment, the light emitting device 10 is electrically connected to the first lead frame 240a through a conductive adhesive layer 210, and is electrically connected to the second lead frame 240b through a wire 205. The light emitting device 10 may be connected to the lead frames 240a and 240b by a flip chip method or a die bonding method other than the wire bonding method.

The resin layer 280 may surround the light emitting device 10 to protect the light emitting device 10. Further, the resin layer 280 may include phosphors 285 to change the wavelength of light emitted from the light emitting device 10. The resin layer 280 may surround at least the light emitting device 10 and the wire 205.

Light of a first wavelength range emitted from the light emitting device 10 may be excited by the phosphors 285 and converted into light of a second wavelength range, and an optical path of the light of the second wavelength range may be changed while passing through an optical path change unit, such as a lens 270.

The lens 270 may change the optical path of light, emitted from the light emitting device 10 and having a wavelength converted by the phosphors 285, through refraction, and particularly, may adjust an orientation angle when the light emitting device module is used in a backlight unit.

The lens 270 may be formed of a material having excellent light transmittance, for example, polymethylmethacrylate (PMMA), polycarbonate (PC), polyethylene (PE) or a resin injection-molded product.

The lens 270 may be fixed to the upper surface of the body 202 through an adhesive disposed between the lens 270 and the body 202. Here, a gap may be generated on the interface between the body 202 and the lens 270 due to a difference of material characteristics, and moisture or oxygen may infiltrate into the light emitting device module through such a gap.

Therefore, the lens 270 and the body 202 at the edge shown by the portion 'D' from among the interface between the body 202 and the lens 270 need to be sealed so as to prevent moisture or oxygen from infiltrating into the light emitting device module from the outside.

FIGS. 18 to 23 are views illustrating various examples of the portion 'D' of FIG. 17 in detail. Hereinafter, the examples of the portion 'D' of FIG. 17 will be described in detail with reference to FIGS. 18 to 23.

Figure 18:
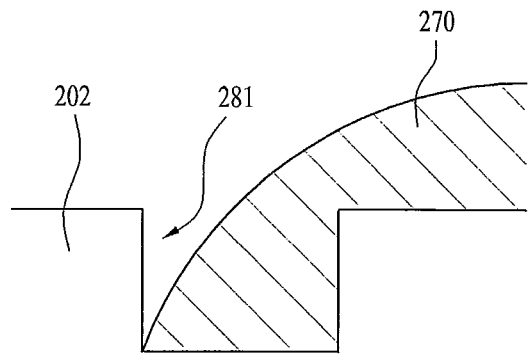
FIGS. 18 to 23 are views illustrating various examples of the portion 'A' of FIG. 17 in detail.

In a structure shown in FIG. 18, a groove 281 is formed on the body 202 at a connection area of the lens 270 and the body 202. The groove 281 may have a structure into which the lens 270 may be fixedly inserted.

Figure 19:
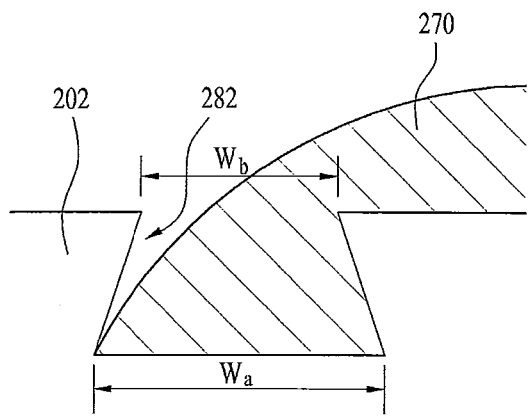

In a structure shown in FIG. 19, a groove 282 is formed on the body 202 such that a width $W_a$ of the upper portion of the groove 282 is greater than a width $W_b$ of the lower portion the groove 282. Particularly, as shown in FIG. 19, the vertical cross-section of the groove 282 has a trapezoidal shape.

In the structure shown in FIG. 19, the edge of the lens 270 is inserted into the groove 282, and thus connecting force between the edge of the lens 270 and the body 202 may be increased. Further, a connection path between the edge of the lens 270 and the body 202 is elongated, and thus an infiltration path of moisture or oxygen from the outside may be elongated and a possibility that external materials infiltrate into the light emitting device module may be reduced.

Figure 20:
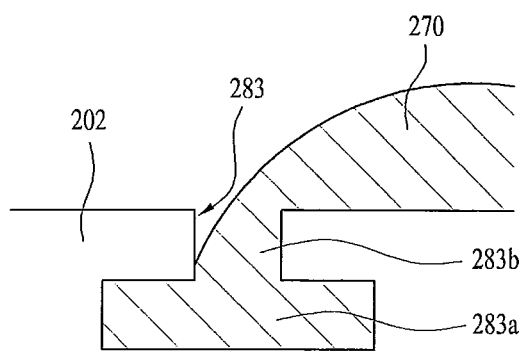

In a structure shown in FIG. 20, a groove 283 is formed on the body 202 such that the cross-sectional area of a lower portion 283a of the groove 283 is greater than the cross-sectional area of an upper portion 283b of the groove 283, thereby preventing infiltration of external materials into the light emitting device module due to elongation of a connection path.

The groove 283 may be formed in a bottle shape such that the cross-sectional area of the upper portion 283b is smaller than the cross-sectional area of the lower portion 283a.

When the lens 270 is formed of an injection molded product using a resin, the lens 270 may be hardened under the condition that the lower portion 283a of the groove 283 formed on the body 202 of FIG. 20 is completely filled with the lens material. In this case, the connecting force between the lens 270 and the groove 283 may be further increased.

Figure 21A:
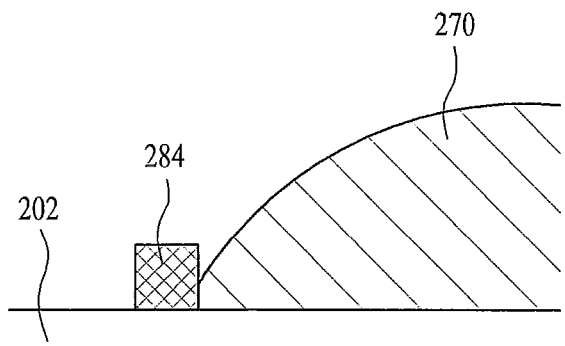

In a structure of FIG. 21A, a dam 284 is disposed at the edge of the body 202 to which the lens 270 is connected. The dam 284 may prevent infiltration of moisture or oxygen from the outside into a gap between the edge of the lens 270 and the body 202.

Figure 21B:
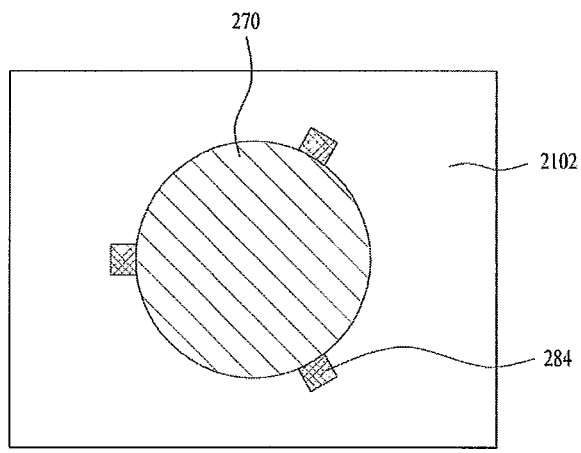

As shown in FIG. 21B, if the dam 284 is disposed at three spots of the edge of the lens 270, the dam 284 may fix 270. When the lens 270 is fixed, a gap between the lens 270 and the body 202 is not generated and thus infiltration of external materials may be prevented.

Figure 21C:
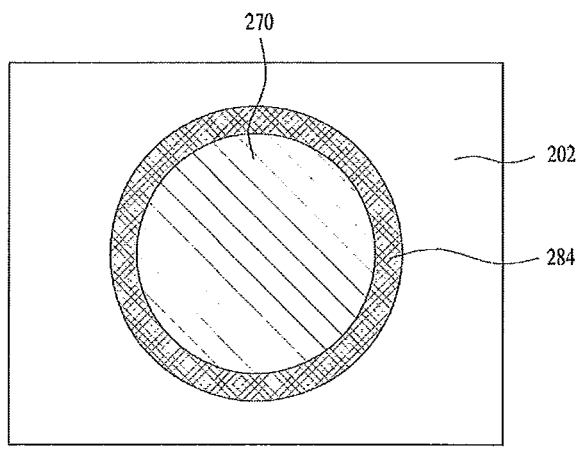

Further, as shown in FIG. 21C, the dam 284 having a ring shape may be disposed along the edge of the lens 270 to surround the lens 270. Here, the dam 284 may serve as a blocking layer of external foreign materials as well as serve to fix the lens 270.

Figure 22:
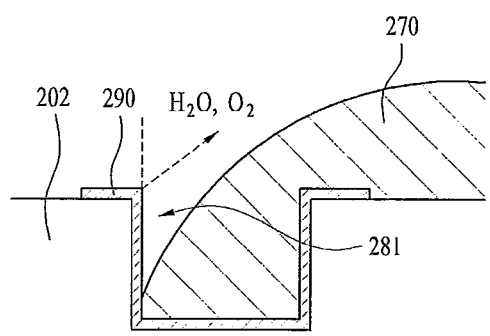
Figure 23:
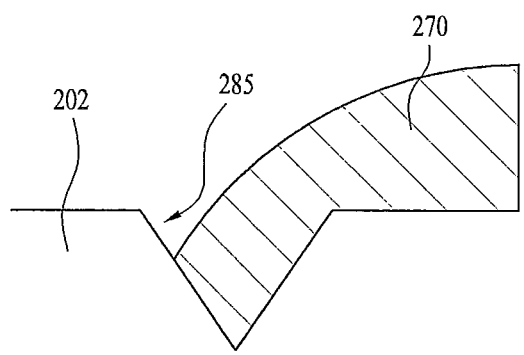

In a structure shown in FIG. 22, a sealant 290 is disposed on the body 202 at a connection area of the groove 281 of the body 202 and the lens 270. The groove 281 may increase a connection path between the lens and the body 202 and increase connecting force between the lens 270 and the body 202, and the sealant 290 may completely prevent infiltration of external materials.

The sealant 290 may be disposed on the grooves 282, 283 and 285 and the dam 284 shown in FIGS. 18 to 21A and FIG. 23 as well as on the groove 281 of FIG. 22. The above-described grooves 282, 283 and 285 may function in the same manner as the dam 284. The sealant 290 may be formed of a material which may increase connecting force between the body 202 and the lens 270, and particularly, a primer composition.

That is, the sealant 290 may be formed by executing primer treatment on the surface of the body 202. Primer treatment refers to polymer treatment executed on a base material, such as a polymer film, to reinforce connecting force among the polymer film, the body 202 and the sealant 290.

A polymer material, such as acryl, ester or urethane, may be used in primer treatment, and the sealant 290 may be formed by applying and coating the polymer material on the base material. Here, the primer composition may be disposed in plural layers to increase connecting force among the sealant 290, the body 202 and the lens 270.

Figure 24:
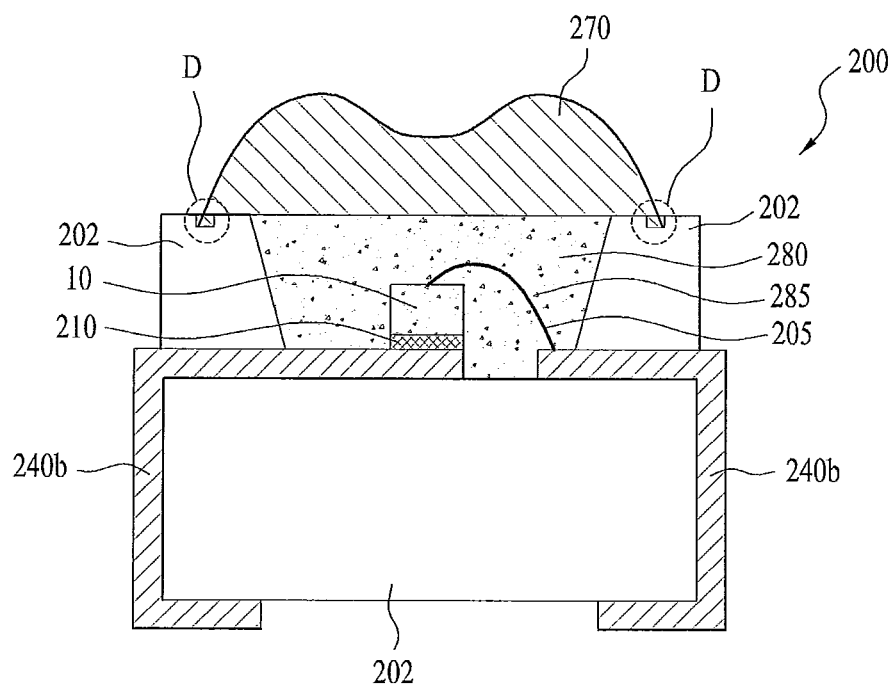
FIG. 24 is a longitudinal-sectional view of a light emitting device module in accordance with an eighth embodiment.

FIG. 24 is a longitudinal-sectional view of a light emitting device module in accordance with an eighth embodiment.

The light emitting device module in this embodiment has the same structure as the light emitting device module shown in FIG. 17 except that the center of the upper surface of the lens 270 is depressed. Such a shape of the lens 270 serves to adjust the orientation angle of the light emitting device module, and may be converted into other shapes.

In the above-described light emitting device modules, infiltration of moisture or oxygen from the outside is prevented due to increase in connecting force between the body 202 and the lens 270, elongation of a connection path therebetween and sealing using a primer composition, and thus durability of the light emitting device is improved due to prevention of infiltration of moisture or oxygen from the outside, thereby increasing the lifespan of the light emitting device module and preventing lowering of color feeling.

An array of a plurality of light emitting device modules in accordance with the embodiments may be disposed on a substrate, and optical members, such as a light guide plate, a prism sheet, a diffusion sheet, etc., may be disposed on an optical path of the light emitting device modules. The light emitting device modules, the substrate and the optical members may function as a light unit. In accordance with another embodiment, the semiconductor light emitting devices or the light emitting device modules in accordance with the above-described embodiments may constitute a display apparatus, an indicating apparatus or a lighting system, and, for example, the lighting system may include a lamp or a streetlight. Hereinafter, as examples of a lighting system including the above-described light emitting device modules, a lighting apparatus and an image display apparatus will be described.

Figure 25:
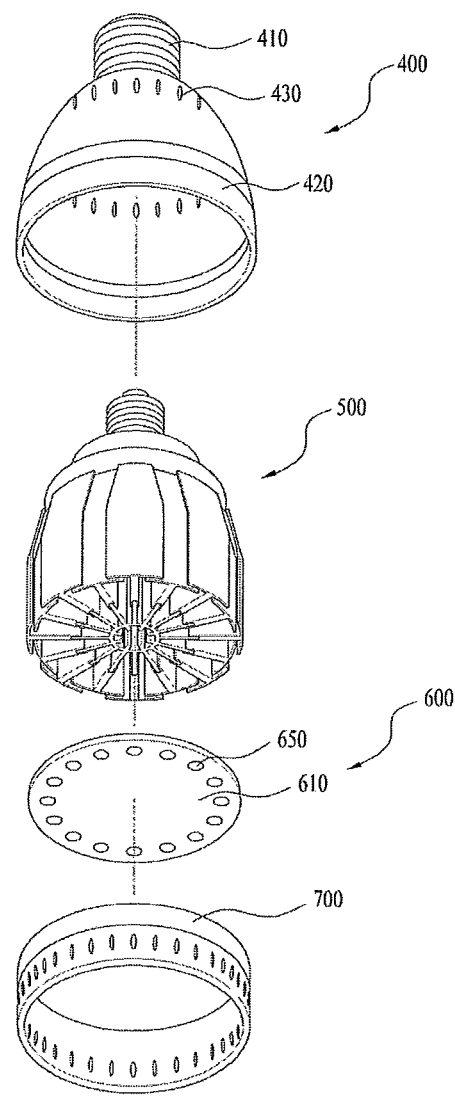
FIG. 25 is an exploded perspective view of a lighting apparatus including light emitting device modules in accordance with one embodiment.

FIG. 25 is an exploded perspective view of a lighting apparatus including light emitting device modules in accordance with one embodiment.

The lighting apparatus in accordance with this embodiment includes a light source 600 to project light, a housing 400 in which the light source 600 is installed, a heat dissipation unit 500 to dissipate heat generated by the light source 600, and a holder 700 to connect the light source 600 and the heat dissipation unit 500 to the housing 400.

The housing 400 includes a socket connector 410 connected to an electrical socket (not shown) and a body 420 connected to the socket connector 410 and accommodating the light source 600. One air flow hole 430 may be formed through the body 420.

A plurality of air flow holes 430 may be disposed on the body 420 of the housing 400. One air flow hole 430 may be disposed, or plural air flow holes 430 may be disposed in a radial shape, as shown in FIG. 25, or in various other shapes.

The light source 600 includes a plurality of light emitting device packages 650 on a substrate 610. Here, the substrate 610 may have a shape which is capable of being inserted into an opening of the housing 400, and may be formed of a material having high heat conductivity to transmit heat to the heat dissipation unit 500, as described later.

The holder 700 is disposed under the light source 600. The holder 700 may include a frame and air flow holes. Further, although not shown in FIG. 25, optical members may be disposed under the light source 600 so as to diffuse, scatter or converge light emitted from the light emitting device packages 650 of the light source 600.

Figure 26:
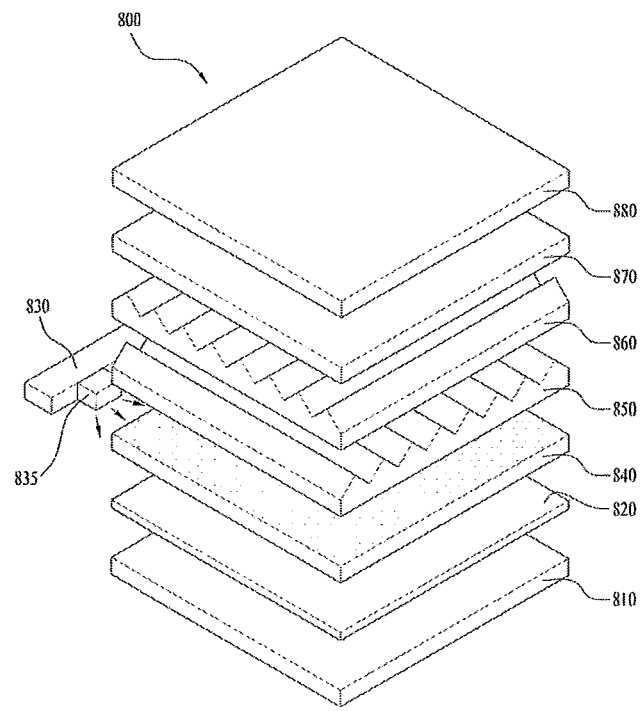
FIG. 26 is an exploded perspective view of an image display apparatus including light emitting device modules in accordance with one embodiment.

FIG. 26 is an exploded perspective view of an image display apparatus including light emitting device modules in accordance with one embodiment.

As shown in FIG. 26, the image display apparatus 800 in accordance with this embodiment includes a light source module, a reflective plate 820 disposed on a bottom cover 810, a light source module to emit light, a light guide plate 840 disposed in front of the reflective plate 820 to guide light emitted from the light source module to the front part of the display apparatus, a first prism sheet 850 and a second prism sheet 860 disposed in front of the light guide plate 840, a panel 870 disposed in front of the second prism sheet 860, and a color filter 880 disposed in front of the panel 870.

The light source module includes a substrate 830 and light emitting device modules 835 disposed on the substrate 830.

Here, the substrate 830 may be a PCB, and the light emitting device modules 835 may be the above-described light emitting device modules.

The bottom cover 810 may accommodate the components within the display apparatus 800. Further, the reflective plate 820 may be provided as a separate component, as shown in FIG. 26, or be provided by coating the rear surface of the light guide plate 840 or the front surface of the bottom cover 810 with a material having high reflectivity.

Here, the reflective plate 820 may be formed of a material having high reflectivity and usable as an ultra-thin film, such as polyethylene terephthalate (PET).

Further, the light guide plate 840 scatters light emitted from the light emitting device modules 835 to uniformly distribute the light throughout the entirety of a screen of a liquid crystal display. Therefore, the light guide plate 840 may be formed of a material having a high index of refraction and high transmittance, such as polymethylmethacrylate (PMMA), polycarbonate (PC), or polyethylene (PE).

The first prism sheet 850 may be formed of a polymer having light transmittance and elasticity on one surface of a support film, and the polymer may have a prism layer in which a plurality of 3D structures is repeated. Here, the plural structures may be disposed in a stripe pattern in which ridges and valleys are repeated, as shown in FIG. 26.

The arrangement direction of ridges and valleys on one surface of a support film of the second prism sheet 860 may be perpendicular to the arrangement direction of the ridges and valleys on one surface of the support film of the first prism sheet 850. This serves to uniformly distribute light transmitted from the light source module and a reflective sheet to the entire surface of the panel 870.

Although this embodiment illustrates optical sheets as including the first prism sheet 850 and the second prism sheet 860, the optical sheets may include other combinations, for example, a micro-lens array, a combination of a diffusion sheet and a micro-lens array, or a combination of a prism sheet and a micro-lens array.

The panel 870 may employ a liquid crystal display panel, or other kinds of display apparatuses requiring a light source in addition to the liquid crystal display panel.

The panel 870 has a structure in which a liquid crystal layer is located between both glass substrates and polarizing plates are respectively mounted on the glass substrates to utilize polarization of light. Here, the liquid crystal layer has intermediate properties between a liquid and a solid in which organic molecules having fluidity like a liquid, i.e., liquid crystals, are regularly disposed, and displays an image using change of molecular arrangement by an external electric field.

The liquid crystal display panel used in the display apparatus is an active matrix type, and uses transistors as switches to adjust voltage applied to respective pixels.

Further, the color filter 880 is disposed on the front surface of the panel 870, and transmits only red, green and blue light projected by the panel 870 per pixel to display an image.

Figure 27:
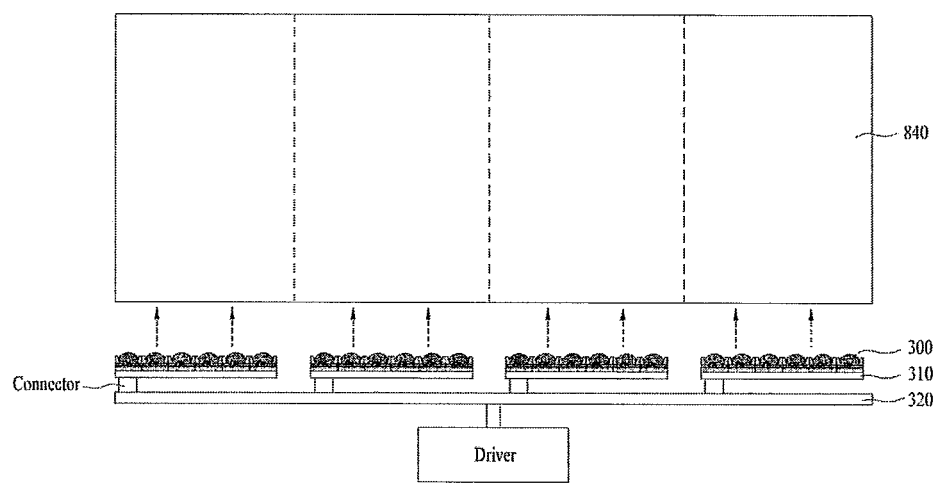
FIG. 27 is a view illustrating one example of drive of the light emitting device modules of the image display apparatus of FIG. 26.

FIG. 27 is a view illustrating one example of drive of the light emitting device modules of the image display apparatus of FIG. 26.

A driver of the light emitting device modules supplies drive signals or current to respective strings 202 through a substrate 220 and connectors. Six to eight light emitting device modules are disposed in each string 202. Here, when different drive signals are supplied to the light emitting modules disposed in the respective strings 202, light may be divisionally supplied to areas separated from each other by a dotted line on the light guide plate 840.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device module comprising:
   a first lead frame and a second lead frame electrically separated from each other;
   a light emitting device electrically connected to the first lead frame and the second lead frame, the light emitting device includes a light emitting structure having a first conduction type semiconductor layer, an active layer, and a second conduction type semiconductor layer;
   a dam disposed at the peripheral area of the light emitting device;
   a resin layer surrounding the light emitting device and disposed at the inner area of the dam;
   a reflective member disposed at the peripheral area of the dam and including an inclined plane formed on at least one side surface thereof; and
   a PSR(photo solder resist) layer disposed between the first lead frame and the second lead frame and the reflective member is disposed on the PSR,
   wherein the PSR layer contacts the first lead frame and the second lead frame in a horizontal direction,
   wherein the PSR layer is non-overlapped with the first lead frame and the second lead frame in a vertical direction,
   wherein the PSR layer, the first lead frame and the second lead frame are a portion of a bottom of a cavity,
   wherein the inclined plane is a side surface of the cavity, and
   wherein a height of a lower surface of the reflective member from a bottom of the light emitting device module is equal to or greater than a height of an user surface of the first lead frame and the second lead frame from the bottom of the light emitting device module.

2. The light emitting device module according to claim 1, further comprising a first electrode pad and a second electrode pad respectively disposed on at least partial areas of the first lead frame and the second lead frame.

3. The light emitting device module according to claim 1, wherein the horizontal cross-section of the inclined plane forms a curved shape around the light emitting device.

4. The light emitting device module according to claim 1, wherein the height of the dam is 40 μm to 60 μm.

5. The light emitting device module according to claim 1, wherein at least one stepped structure is formed on the upper surface of the dam.

6. The light emitting device module according to claim 5, wherein the edge of the resin layer is disposed to the stepped structure.

7. The light emitting device module according to claim 1, wherein a groove is formed on the upper surface of the dam, and the edge of the resin layer is disposed to the groove.

8. The light emitting device module according to claim 1, further comprising a fixing member configured to fix the reflective member to the PSR layer.

9. The light emitting device module according to claim 1, wherein the dam is formed on the PSR layer through printing.

10. The light emitting device module according to claim 1, wherein at least one of the first lead frame and the second lead frame disposed on a heat dissipation layer through an insulating layer disposed therebetween.

11. The light emitting device module according to claim 1, wherein the width of the uppermost end of the inclined plane of the reflective member is 1.5 times to 2 times the width of the resin layer disposed to the dam.

12. A lighting system comprising:
  a light emitting device module including:
    a first lead frame and a second lead frame electrically separated from each other;
    a light emitting device electrically connected to the first lead frame and the second lead frame, the light emitting device includes a light emitting structure having a first conduction type semiconductor layer;
    an active layer;
    a second conduction type semiconductor layer;
    a dam disposed at the peripheral area of the light emitting device;
    a resin layer surrounding the light emitting device and disposed at the inner area of the dam;
    a reflective member disposed at the peripheral area of the dam and including an inclined plane formed on at least one side surface thereof; and
    a PSR(photo solder resist) layer disposed between the first lead frame and the second lead frame and the reflective member is disposed on the PSR;
    wherein the PSR layer contacts the first lead frame and the second lead frame in a horizontal direction,
    wherein the PSR layer is non-overlapped with the first lead frame and the second lead frame in a vertical direction,
    wherein the PSR layer, the first lead frame and the second lead frame are a portion of a bottom of a cavity,
    wherein the inclined plane is a side surface of the cavity, and
    wherein a height of a lower surface of the reflective member from a bottom of the light emitting device module is same to or higher than a height of an upper surface of the first lead frame and the second lead frame from the bottom of the light emitting device module; and
  an optical member for transmission of light from the light emitting device module.

13. The light emitting device module according to claim 8, wherein the fixing member is a double-sided adhesive or a double-sided adhesive tape.

* * * * *